United States Patent
Yamamoto et al.

(10) Patent No.: US 7,556,977 B2
(45) Date of Patent: Jul. 7, 2009

(54) SEMICONDUCTOR MANUFACTURING METHOD AND SEMICONDUCTOR LASER DEVICE MANUFACTURING METHOD

(75) Inventors: Kei Yamamoto, Yamatokooriyama (JP); Junichi Nakamura, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/822,604

(22) Filed: Jul. 9, 2007

(65) Prior Publication Data

US 2008/0014671 A1    Jan. 17, 2008

(30) Foreign Application Priority Data

Jul. 11, 2006    (JP)    ............................. 2006-190274

(51) Int. Cl.
*H01L 21/00*    (2006.01)
(52) U.S. Cl. ........................... 438/46; 438/45; 438/488; 438/931; 257/79; 117/104
(58) Field of Classification Search ................ 257/79, 257/86, 103; 438/480–490, 45–46
See application file for complete search history.

(56) References Cited

U.S. PATENT DOCUMENTS

2004/0211967 A1*  10/2004  Hirayama et al. ............. 257/79
2004/0227151 A1*  11/2004  Konno et al. ................ 257/103

FOREIGN PATENT DOCUMENTS

| JP | 1-194379 | 8/1989 |
| JP | 6-45708 | 2/1994 |
| JP | 9-36426 | 2/1997 |
| JP | 2001-24278 | 1/2001 |
| JP | 2005-32893 | 2/2005 |

* cited by examiner

*Primary Examiner*—N Drew Richards
*Assistant Examiner*—Mamadou Diallo
(74) *Attorney, Agent, or Firm*—Nixon & Vanderhye P.C.

(57) ABSTRACT

There are provided preflow periods t11, t12 in which group III element materials TMG, TMA and TMI are not supplied from a group III element material container to a reaction region (reactor), while a group V element material $PH_3$ and an Mg dopant material are supplied from a group V element material container and a dopant material container to the reaction region (reactor) after an Mg-undoped group III-V compound semiconductor layer is crystallinically grown and before an Mg-doped group III-V compound semiconductor layer is crystallinically grown. According to the semiconductor manufacturing method, an Mg doping profile can be accurately controlled.

8 Claims, 9 Drawing Sheets

SEMICONDUCTOR MANUFACTURING METHOD AND SEMICONDUCTOR LASER DEVICE MANUFACTURING METHOD

CROSS-REFERENCE TO RELATED APPLICATIONS

This nonprovisional application claims priority under 35 U.S.C. §119(a) on Patent Application No(s). 2006-190274 filed in Japan on Jul. 11, 2006, the entire contents of which are hereby incorporated by reference.

BACKGROUND OF THE INVENTION

The present invention relates to a semiconductor manufacturing method and more particularly to a semiconductor manufacturing method for crystallinically growing a group III-V compound semiconductor using Mg as a dopant.

The present invention also relates to a semiconductor laser device manufacturing method for manufacturing an AlGaInP based semiconductor laser device by using the semiconductor manufacturing method.

In recent years, semiconductor laser devices of a group III-V compound semiconductor (e.g., AlGaInP) system as those used for DVD (Digital Versatile Disc) drives are required to have severe specifications of the capabilities of high efficiency, low operating voltage, good temperature characteristic, high power operation and so on. In order to achieve the specifications, it is required to accurately control the doping profile of the dopants in the crystal growth stage.

Although it has been general to use Zn as a p-type dopant for the group III-V compound semiconductors, it is desired to select a dopant that is hard to diffuse in order to obtain a steep doping profile. Therefore, as described in, for example, JP H06-45708 A and JP 2001-24278 A, Mg has come to be used as a p-type dopant in place of Zn.

The problems that the present invention intends to solve are described in detail.

i) Necessity of Power Increase

In order to achieve a high power with a semiconductor laser device, it is important to emit more light with a small amount of carriers injected and to reduce the absorption of oscillation light. That is, a low threshold current and high efficiency are demanded. This is because, if the efficiency is poor, a large amount of current is required for outputting same optical output, and the chip temperature of the semiconductor laser device rises, resulting in causing deterioration and difficulties in further increasing the power.

As a reason for the reduction in the efficiency, an increase in the absorption of oscillating light can be considered. That is, when the optical output is increased, part of the output is absorbed and transformed into heat, and this also raises the chip temperature of the semiconductor laser device and causes the deterioration of the semiconductor laser device.

Therefore, it is demanded that the absorption of oscillating light is a little, the efficiency is high, and crystallinity is good in the crystal growth stage. From this point of view, Mg can be enumerated as a prospect for the p-type dopant for the group III-V compound semiconductors.

ii) Dopant and Doping Profile

When dopants are diffused into the active layer, the crystalline orientation of the active layer is disordered, not only the efficiency is reduced by the degraded crystallinity of the active layer itself, but also the dopants themselves disadvantageously become absorbers. Therefore, the efficiency is further reduced, and the reliability is also lowered.

Moreover, the distribution of light expands in the neighborhood of the active layer. Therefore, when the dopants especially in nonactivated state exist more than necessary in a location close to the active layer even if the dopants are not diffused up to the active layer, the dopants become optical absorbers and cause reduced efficiency and lowered reliability.

On the other hand, when the undoped region is increased in the neighborhood of the active layer in order to prevent the dopants from diffusing into the active layer, the crystallinity of the active layer is maintained, and the absorption by the dopants is also reduced. However, it becomes difficult for the carriers to be injected into the active layer, and the efficiency is disadvantageously reduced. Moreover, the carriers easily overflow particularly in operation at an elevated temperature in this case, and the temperature characteristic deteriorates.

Therefore, it is desired that the dopants exist sufficiently and not excessively in amount to a location immediately close to the active layer and no dopant exists in the active layer. That is, it is desired that a doping profile of a steep change (almost in steps) in dopant concentration in the crystal growth direction (depthwise direction) in the neighborhood of the active layer of a semiconductor laser device (the profile referred to as a "steep doping profile").

iii) Mg Doping Delay

If Mg is used as a dopant when crystal growth is carried out by, for example, an MOCVD (metal-organic chemical vapor deposition) method, a phenomenon that Mg is adsorbed and accumulated to a dopant supply piping (precisely a portion downstream from a valve for changeover between supply and nonsupply) between a dopant material container and a reactor (furnace for reaction) and so on (so-called the "memory effect") occurs. Therefore, a time delay (so-called the "doping delay") from when Mg starts being flowed from the dopant material container until when the doping is actually started in the crystals occurs. Moreover, even after the supply of Mg from the dopant material container is stopped, the Mg accumulated in the dopant supply piping flows to the reactor, disadvantageously doping the crystals.

As described above, there is a problem that it is difficult to accurately control the Mg doping profile due to the memory effect.

iv) Mg Diffusion Front

Atoms in the crystals tend to diffuse from the high concentration side to the low concentration side when there is a concentration difference. In the semiconductor laser device, it is required that the n-type and the p-type are selectively fabricated with interposition of the active layer, and it is required that the donor and the acceptor for forming the n-type and the p-type do not exist in the active layer but sufficiently exist in the n-type layer and the p-type layer. That is, a great concentration difference occurs between the active layer and the n-type layer and the p-type layer that interpose it therebetween. Diffusibility also differs depending on the type of the atoms, and diffusion is caused by the concentration difference even when Mg is used as the p-type dopant.

Therefore, it is required to control the extent of diffusion of Mg from the Mg-doped layer to the nondoped layer (this is referred to as a "Mg diffusion front").

SUMMARY OF THE INVENTION

An object of the present invention is to provide a semiconductor manufacturing method for crystallinically growing a group III-V compound semiconductor, the method capable of accurately controlling the Mg doping profile.

Another object of the present invention is to provide a semiconductor laser device manufacturing method capable of manufacturing an AlGaInP based semiconductor laser device, which has a low threshold current, high efficiency and a good temperature characteristic and is able to operate with high power by using the semiconductor manufacturing method.

In order to achieve the above object, there is provided a semiconductor manufacturing method for crystallinically growing an Mg-doped group III-V compound semiconductor layer by transporting a group III element material, a group V element material and an Mg dopant material from a group III element material container, a group V element material container and a dopant material container, respectively, to a reaction region through a group III element material transport line, a group V element material transport line and a dopant material transport line and reacting the group III element material with the group V element material in the reaction region, the method comprising:

providing a group III element supply/nonsupply changeover section, a group V element supply/nonsupply changeover section and a dopant supply/nonsupply changeover section for changeover between supply and nonsupply of the materials that pass through the respective transport lines to the reaction region for the group III element material transport line, the group V element material transport line and the dopant material transport line, and crystallinically growing the Mg-undoped group III-V compound semiconductor layer in a state in which supply of the Mg dopant material to the reaction region is stopped by the dopant supply/nonsupply changeover section; and thereafter, before the Mg-doped group III-V compound semiconductor layer is crystallinically grown, providing a preflow period in which supply of the group III element material to the reaction region is stopped by the group III element supply/nonsupply changeover section, while the group V element material and the Mg dopant material are supplied to the reaction region from the group V element material container and the dopant material container through the group V element supply/nonsupply changeover section and the dopant supply/nonsupply changeover section.

In this case, "Mg-doped group III-V compound semiconductor layer" means a group III-V compound semiconductor layer that is intended to be doped with Mg, and "Mg-undoped group III-V compound semiconductor layer" means a group III-V compound semiconductor layer that is not intended to be doped with Mg.

According to the semiconductor manufacturing method of the present invention, by providing the preflow period, the doping delay of Mg is eliminated, and a steep Mg doping profile is consequently obtained. In concrete, if the Mg dopant material is flowed from the dopant material container after the Mg-undoped group III-V compound semiconductor layer is crystallinically grown, the Mg dopant material is adsorbed and accumulated in the dopant material transport line (precisely a portion downstream from the dopant supply/nonsupply changeover section), the flow channel, the wafer tray and so on (memory effect). In this case, according to the present invention, the Mg dopant material can be stabilized by being sufficiently accumulated in the dopant material transport line and the like by providing the preflow period. Therefore, the Mg dopant material is immediately supplied to the reaction region in the stage in which the Mg-doped group III-V compound semiconductor layer is crystallinically grown, so that the Mg-doped group III-V compound semiconductor layer is grown without causing the doping delay. As a result, a steep doping profile is obtained.

Moreover, by providing the preflow period, control of the diffusion front becomes possible. In concrete, the present inventor discovered that the Mg diffusion front did not depend on the feed rate of the Mg dopant material so long as the feed rate of the Mg dopant material in the preflow period was not extremely increased under the same growth conditions but determined depending on the doping rate of Mg in the Mg-doped group III-V compound semiconductor layer. That is, if the doping rate of Mg in the Mg-doped group III-V compound semiconductor layer is determined, Mg can be prevented from diffusing into, for example, the active layer of the semiconductor laser device by forming the undoped layer (Mg-undoped group III-V compound semiconductor layer) that has a thickness corresponding to the depth of the diffusion front in accordance with the rate. That is, the position of the diffusion front can be controlled.

As described above, according to the semiconductor manufacturing method of the present invention, the Mg doping profile can be accurately controlled.

In one embodiment of the invention, each of the group III-V compound semiconductor layers is an AlGaInP layer.

The semiconductor manufacturing method of the embodiment is easily applied to the manufacturing of an AlGaInP based semiconductor laser device.

In one embodiment of the invention, a feed rate of the Mg dopant material is variably set in the preflow period.

According to the semiconductor manufacturing method of the embodiment, the Mg doping profile can be more accurately controlled, and a steep Mg doping profile is consequently obtained.

In this case, the verbal phrase of "variably setting" the feed rate of the Mg dopant material includes changeover in a plurality of two or more steps and continuous change.

Moreover, the "feed rate of the Mg dopant material" means the feed rate of the Mg dopant material fed on the dopant material container side toward the reaction region (it is not the amount of the Mg dopant material that actually reaches the reaction region through the dopant material transport line).

As already described, it has become possible to crystallinically grow the Mg-doped group III-V compound semiconductor layer without causing the doping delay by providing the preflow period. However, the above arrangement is insufficient in order to obtain the ideal stepped doping profile at the interface (referred to as a doping interface) between the Mg-undoped group III-V compound semiconductor layer and the Mg-doped group III-V compound semiconductor layer. That is, when the Mg preflow is extremely small, the Mg-doped group III-V compound semiconductor layer does not reach the desired doping rate in the initial growth stage, and the doping rate increases gradually in accordance with the crystal growth. Conversely, it was discovered that, when the Mg preflow was extremely large, doping once decreased in accordance with the crystal growth and increased again (pileup of Mg occurs at the doping interface) although the doping rate increased at the doping interface. When the Mg preflow is further increased, Mg largely piles up at the doping interface, and the diffusion front is also largely shifted, consequently failing in controlling the doping profile. Moreover, it was discovered that the Mg piling up at the doping interface was mostly nonactivated and remained at the doping interface. Therefore, when such a structure is applied to a semiconductor laser device, efficiency is reduced due to the nonactivated Mg, and it becomes difficult to increase the power.

Accordingly, the feed rate of the Mg dopant material is variably set in the preflow period. For example, the preflow is carried out so that Mg is sufficiently accumulated at the beginning of the preflow period (first preflow), and the feed rate of Mg is set to a charge appropriate for growing the Mg-doped group III-V compound semiconductor layer at the end of the preflow period (second preflow). With this arrangement, it becomes possible to obtain a steep stepped doping profile.

In one embodiment of the invention, the preflow period is divided into two parts of a first preflow period and a subsequent second preflow period, the feed rate of the Mg dopant material is set to a first flow rate greater than a certain charge in the first preflow period, and the feed rate of the Mg dopant material from the dopant material container is set to a second flow rate identical to the charge in the second preflow period.

In this case, the "charge" indicates the feed rate of the Mg dopant material appropriate for growing the Mg-doped group III-V compound semiconductor layer.

According to the semiconductor manufacturing method of the embodiment, the feed rate of the Mg dopant material is set to the first flow rate greater than a certain charge in the first preflow period, and therefore, Mg can be sufficiently charged in the dopant material transport line. On the other hand, the feed rate of the Mg dopant material from the dopant material container is set to the second flow rate identical to the charge in the second preflow period, and therefore, the feed rate of the Mg dopant material can be stabilized to the charge. As a result, it has become possible to obtain a steep stepped doping profile.

In one embodiment of the invention, the preflow period is divided into two parts of a first preflow period and a subsequent second preflow period, the feed rate of the Mg dopant material is set to a first flow rate at which an activation ratio of Mg in the Mg-doped group III-V compound semiconductor layer is not higher than 50% in the first preflow period, and the feed rate of the Mg dopant material is set to a second flow rate at which the activation ratio of Mg in the Mg-doped group III-V compound semiconductor layer is not lower than 80% in the second preflow period.

The present inventor examined the ratio (activation ratio) of the doped Mg that became active carriers. As a result, it was discovered that the activation ratio reached the ceiling when the Mg doping rate was increased. That is, when the Mg dopant flow rate is increased, Mg atoms are taken into the crystals, but atoms that do not operate as a carrier increase. The Mg-doped group III-V compound semiconductor layer needs to have a high activation ratio of Mg in order to increase the efficiency. However, when the preflow is carried out at a flow rate (feed rate of the Mg dopant material) at which the activation ratio of Mg is merely increased, the flow rate is too small to sufficiently charge Mg in the dopant material transport line. Therefore, a steep doping profile was not able to be obtained.

Accordingly, by the semiconductor manufacturing method of the embodiment, the preflow period is divided into two parts of the first preflow period and the subsequent second preflow period. Then, in the first preflow period, the feed rate of the Mg dopant material is set to the first flow rate at which the activation ratio of Mg in the Mg-doped group III-V compound semiconductor layer is not higher than 50%. With this arrangement, Mg can be sufficiently charged in the dopant material transport line. On the other hand, in the second preflow period, the feed rate of the Mg dopant material is set to the second flow rate at which the activation ratio of Mg in the Mg-doped group III-V compound semiconductor layer is not lower than 80%. With this arrangement, the feed rate of the Mg dopant material can be stabilized to the charge. As a result, a steep stepped doping profile was able to be obtained, and the nonactive Mg disappeared at the doping interface, allowing the steep stepped doping profile with the activated carriers to be obtained.

The crystal growth needs to be interrupted during the preflow period. However, when the crystal growth interruption period becomes long, the crystallinity of the interrupted layer interface is remarkably lowered, and this causes the lowered reliability and characteristic deterioration of the device. It is desired to shorten the duration of the preflow period as far as possible.

In one embodiment of the invention, the preflow period is divided into two parts of a first preflow period and a subsequent second preflow period, and the feed rate of the Mg dopant material set in the first preflow period is made to have a value of not smaller than five times and not greater than twenty times the feed rate of the Mg dopant material set in the second preflow period.

According to the semiconductor manufacturing method of the embodiment, the feed rate of the Mg dopant material set in the first preflow period is made to have a value of not smaller than five times and not greater than twenty times the feed rate of the Mg dopant material set in the second preflow period. With this arrangement, Mg can be efficiently adsorbed and charged in the dopant material transport line in the first preflow period. Then, the feed rate of the Mg dopant material can be stabilized in the second preflow period. As a result, the Mg doping profile can be accurately controlled, and the duration of the preflow period can be shortened as a whole.

In one embodiment of the invention, the preflow period is divided into two parts of a first preflow period in which the feed rate of the Mg dopant material is set to a first flow rate and a second preflow period in which the feed rate of the Mg dopant material is set to a second flow rate, and a duration of the first preflow period is set shorter than a duration of the second preflow period and a product of the first flow rate and the duration of the first preflow period is set greater than a product of the second flow rate and the duration of the second preflow period.

According to the semiconductor manufacturing method of the embodiment, the duration of the first preflow period is set shorter than the duration of the second preflow period, and the product of the first flow rate and the duration of the first preflow period is set greater than the product of the second flow rate and the duration of the second preflow period. With this arrangement, Mg can be efficiently adsorbed and charged in the dopant material transport line in the first preflow period. Moreover, since the second preflow period is longer than the first preflow period, the feed rate of the Mg dopant material can be stabilized in the second preflow period. As a result, the Mg doping profile can be accurately controlled, and the duration of the preflow period can be shortened as a whole.

As described above, it is desirable for the first preflow to efficiently adsorb and charge Mg in the dopant material transport line by flowing a large amount of Mg dopant material in a comparatively short time. On the other hand, it is desirable for the second preflow to reduce the flow rate to the charge and stabilize the rate with a comparatively long duration time.

In one embodiment of the invention, the Mg dopant material is biscyclopentadienyl magnesium or bisethyl cyclopentadienyl magnesium.

According to the semiconductor manufacturing method of the embodiment, the Mg dopant material, which is biscyclopentadienyl magnesium (Cp2Mg) or bisethyl cyclopentadienyl magnesium (EtCp2Mg), is actually able to accurately control the Mg doping profile.

In one embodiment of the invention, a semiconductor laser device manufacturing method including the above semiconductor manufacturing method further comprises:

the step of crystallinically growing an n-type AlGaInP cladding layer, a multiple quantum well active layer, an undoped AlGaInP cladding layer as the Mg-undoped group III-V compound semiconductor layer, an Mg-doped AlGaInP cladding layer as the Mg-doped group III-V compound semiconductor layer in this order on an n-type GaAs substrate by an MOCVD method; and providing the preflow period after the undoped AlGaInP cladding layer is grown and before the Mg-doped AlGaInP cladding layer is grown.

According to the semiconductor laser device manufacturing method of the present invention, an AlGaInP based semiconductor laser device, which has a low threshold current, a high efficiency and a good temperature characteristic and is able to operate with a high power can be manufactured.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

Figure 1:
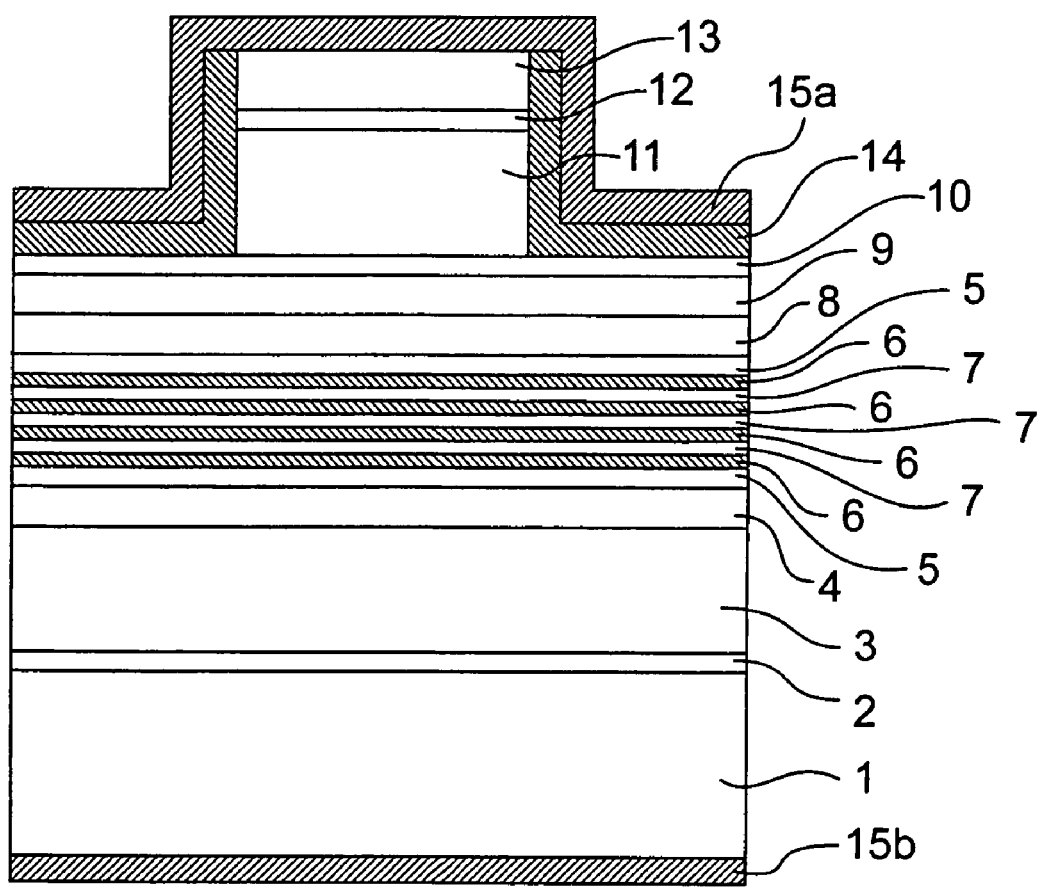
FIG. 1 is a view showing the cross-sectional structure of an AlGaInP based semiconductor laser device manufactured by a semiconductor laser device manufacturing method according to one embodiment of the present invention.

The present invention will be described in detail below by the embodiments shown in the drawings.

The First Embodiment

Figure 9:
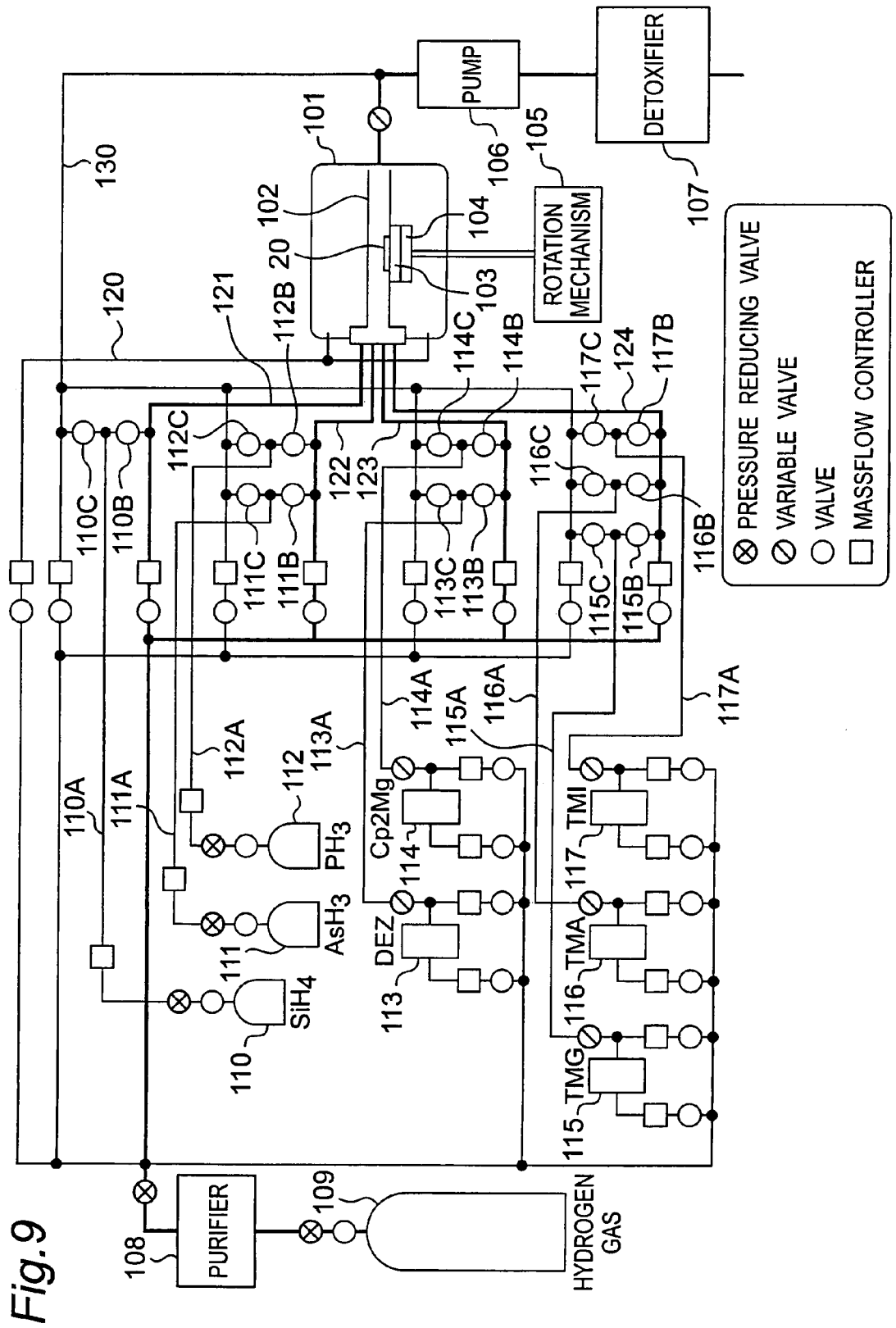
FIG. 9 is a diagram showing the construction of MOCVD used for carrying out the semiconductor manufacturing method of one embodiment of the present invention.

FIG. 9 shows the construction of an MOCVD apparatus for carrying out the semiconductor manufacturing method of one embodiment.

The MOCVD apparatus includes a reactor 101 as a reaction region, a hydrogen gas container 109 that stores hydrogen gas, an $SiH_4$ material container 110 that stores $SiH_4$ gas, an $AsH_3$ material container 111 that stores $AsH_3$ gas as a group V element material, a $PH_3$ material container 112 that stores $PH_3$ gas as a group V element material, a DEZ material container 113 that stores DEZ (diethyl zinc), a CP2Mg material container 114 that stores CP2Mg (biscyclopentadienyl Mg) as an Mg dopant material, a TMG material container 115 that stores TMG (trimethylgallium) as a group III element material, a TMA material container 116 that stores TMA (trimethylaluminum) as a group III element material and a TMI material container 117 that stores TMI (trimethylindium) as a group III element material.

A plurality of main pipes 120, 121, 122, 123, 124 extend from the hydrogen gas container 109 to the reactor 101, and a vent line 130 extends to a pump 106. Pipes 110A, 111A, 112A, 113A, 114A, 115A, 116A, 117A from the material containers 110, 111, 112, 113, 114, 115, 116, 117 join the main pipes 121, 122, 123, 124 via valves 110B, 111B, 112B, 113B, 114B, 115B, 116B, 117B, respectively, and join the vent line 130 via valves 110C, 111C, 112C, 113C, 114C, 115C, 116C, 117C, respectively. The $SiH_4$ gas, $AsH_3$ gas and $PH_3$ gas are transported to the reactor 101 in a state in which they are diluted with hydrogen gas through the respective corresponding pipes. Moreover, DEZ, CP2Mg, TMG, TMA and TMI are transported to the reactor 101 through the respective corresponding pipes in a state in which they are subjected to bubbling with the hydrogen gas from the hydrogen gas container 109 and mixed as vapor with the hydrogen gas. When the materials are supplied from the containers to the reactor 101, the valves 110B through 117B are opened, and the valves 110C through 117C are closed in a changeover manner. When the materials are not supplied from the containers to the reactor 101, the valves 110B through 117B are closed, and the valves 110C through 117C are opened in a changeover manner. That is, the valve pairs (110B, 110C), (111B, 111C) through (117B, 117C) each constitute a supply/nonsupply changeover section of the corresponding material. Moreover, the feed rate of each of the materials is controlled by a massflow controller indicated by a symbol in the figure. A pressure reducing valve indicated by a symbol in the figure is provided at the exit of each of the gas containers, and the valve controls the gas pressure.

In the reactor 101 are provided a flow channel 102 that flows the supplied gas, a susceptor 103 that supports a compound semiconductor wafer 20 of the object to be subjected to crystal growth in the flow channel 102, and a heater block 104 that is provided in contact with the lower surface of the susceptor 103. Although the susceptor 103 concurrently serves as a wafer tray in this apparatus, a wafer tray may be placed on the susceptor 103. By controlling the amount of power supply to the heater block 104 by a temperature controller (not shown) in a feedback manner, the temperature of the heater block 104 (i.e., the temperature of the compound semiconductor wafer 20) is set to the target temperature. Below the reactor 101 is provided a rotation mechanism 105 that rotates the compound semiconductor wafer 20 together with the susceptor 103 and the heater block 104 during crystal growth. The internal pressure of the reactor 101 is set to a target pressure by performing evacuation by the pump 106 via a variable valve indicated by a symbol in the figure. Exhaust gas is processed to be put into a harmless state by a detoxifier 107.

Figure 3A:
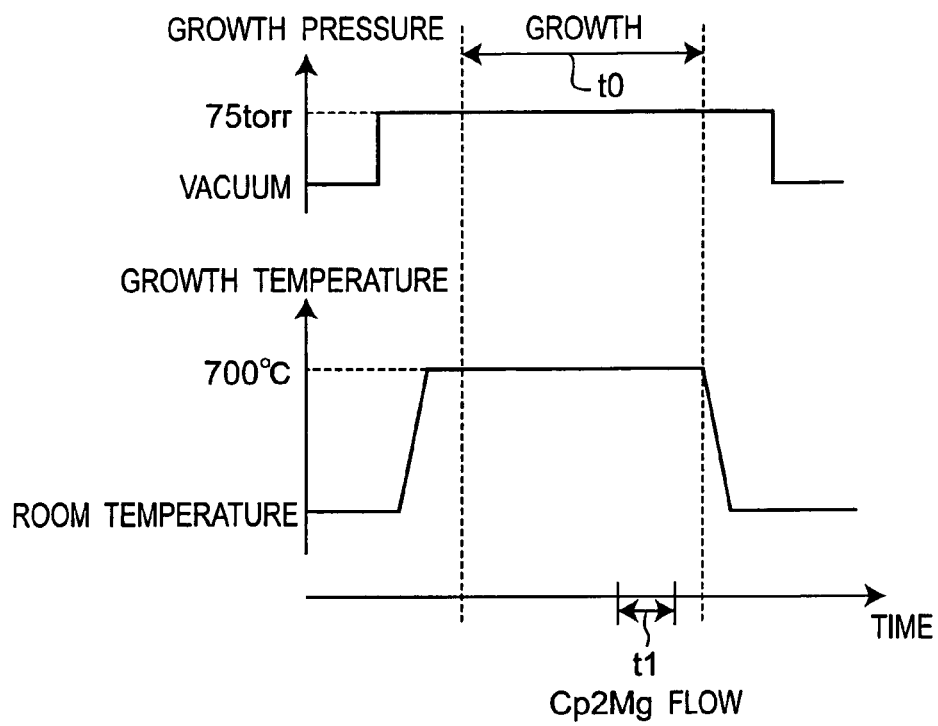
FIG. 3A is a graph showing a sequence of a growth pressure and a growth temperature of MOCVD.

When the crystal growth is carried out by the MOCVD apparatus, the internal pressure of the reactor 101 is controlled to the target pressure (growth pressure), or to 75 Torr in this example as shown in the upper row of FIG. 3A. Moreover, the temperature of the compound semiconductor wafer 20 is controlled to the target temperature (growth temperature), or to 700° C. in this example as shown in the lower row of FIG. 3A. In the period during which the internal pressure of the reactor 101 is maintained at the target pressure and the temperature of the compound semiconductor wafer 20 is maintained at the target temperature, actual crystal growth is carried out (crystal growth period t0). Moreover, in the crystal growth period t0, a period t1 during which the CP2Mg, or the Mg dopant material is flowed is set.

Next, a semiconductor manufacturing method of one embodiment by means of the above MOCVD apparatus is described.

1) Examination of Mg Doping

Figure 3B:
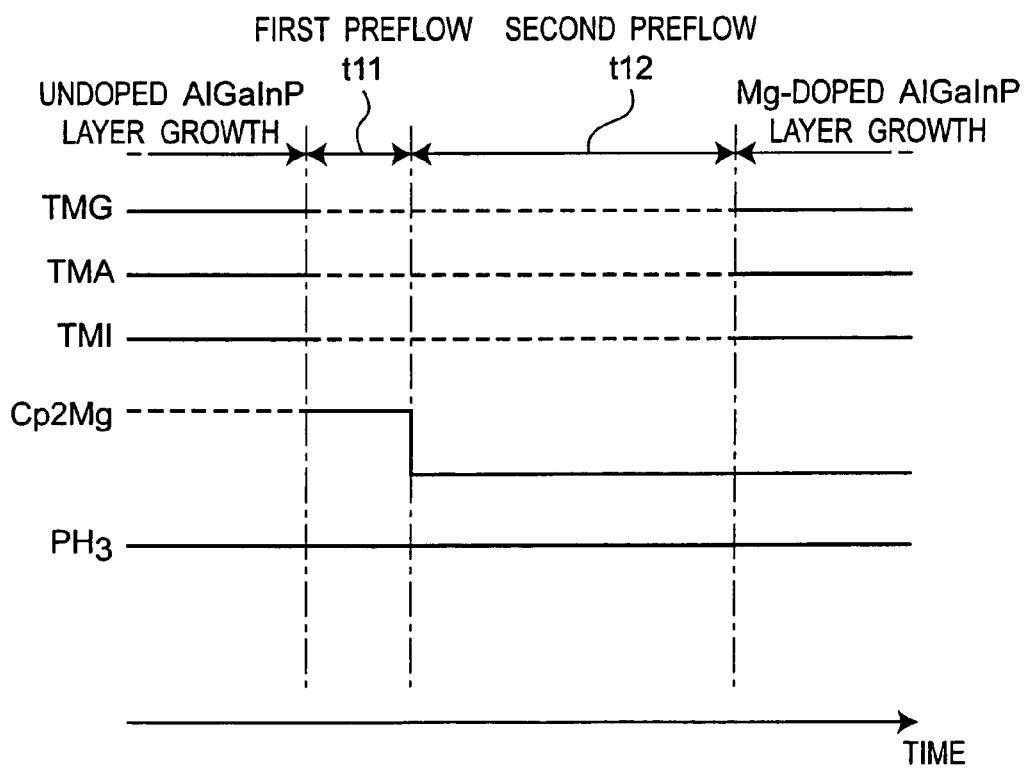
FIG. 3B is a graph showing a sequence when two-step preflow of an Mg dopant is carried out.

The present inventors carried out the crystal growth of an undoped $(Al_{0.7}Ga_{0.3})_{0.511}In_{0.489}P$ layer (thickness: 0.2 μm) as an Mg-undoped group III-V compound semiconductor layer and an Mg-doped $(Al_{0.7}Ga_{0.3})_{0.511}In_{0.489}P$ layer (thickness: 1 μm) as an Mg-doped group III-V compound semiconductor layer in this order on a GaAs substrate (not shown) according to the growth sequence shown in FIG. 3B. In FIG. 3B, the layers are indicated abbreviated as an undoped AlGaInP layer and an Mg-doped AlGaInP layer, respectively. The solid line of each material represents the "supply" state of the supply/nonsupply changeover section of the material, and the dashed line represents the "nonsupply" state of the supply/nonsupply changeover section of the material.

As is apparent from FIG. 3B, according to the growth sequence, preflow periods t11, t12 are provided after the undoped AlGaInP layer is crystallinically grown and before the Mg-doped AlGaInP layer is crystallinically grown. In the preflow periods t11, t12, the supply of TMG, TMA and TMI, which are the group III element materials, is stopped, while the $PH_3$ that is the group V element material and the CP2Mg that is the Mg dopant material are flowed.

In this example, the preflow period is divided into two parts of the first preflow period t11 in which the CP2Mg feed rate is set to a first flow rate and the subsequent second preflow period t12 in which the CP2Mg feed rate is set to a second flow rate smaller than the first flow rate. The duration of the second preflow period t12 is set longer than the duration of the first preflow period t11.

The present inventors carried out growth by variously changing the preflow conditions, unlimitedly to the example shown in FIG. 3B. Then, the doping profile was examined by carrying out SIMS (secondary ion mass spectrometry) of the samples produced on each condition.

2) Without Preflow

Figure 4:
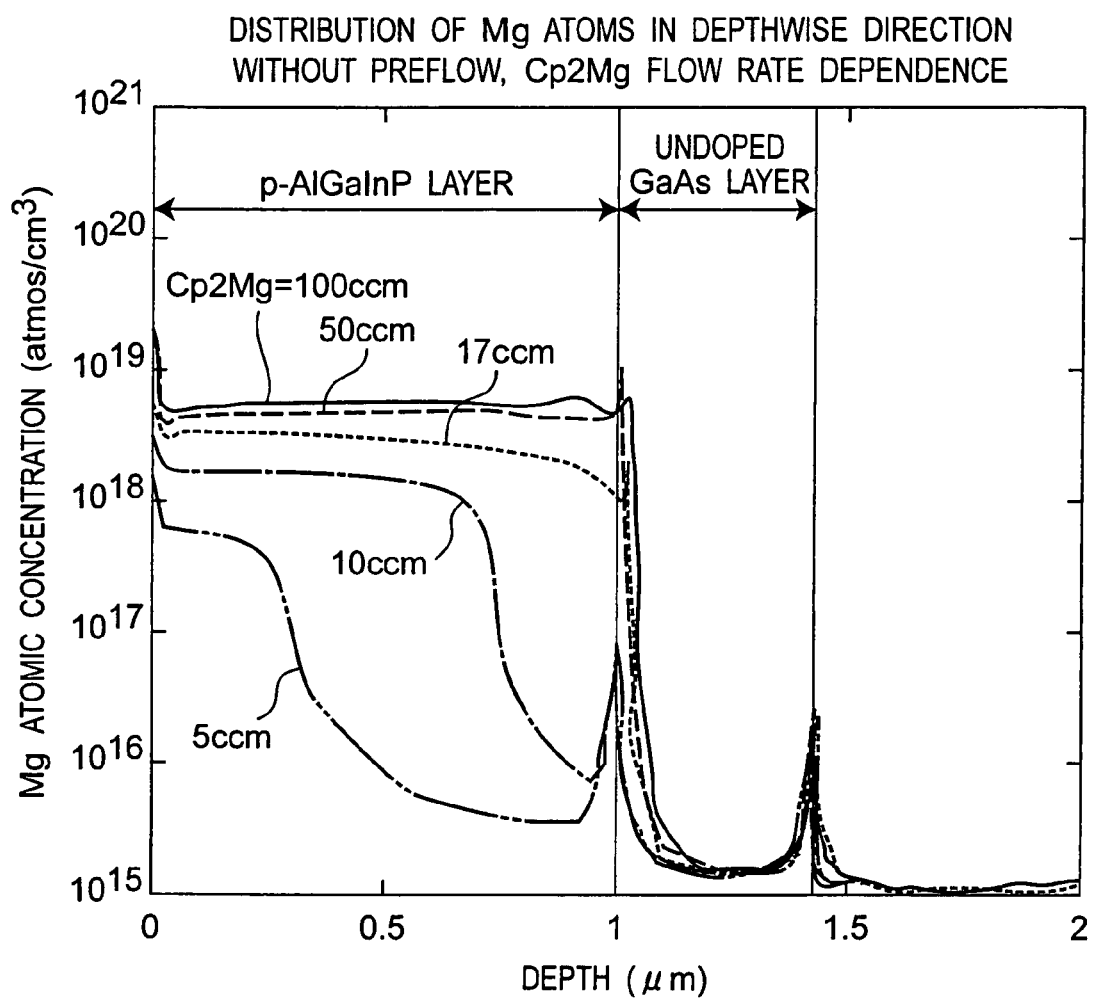
FIG. 4 is a graph showing doping profiles without Mg preflow.

First of all, the present inventor examined the condition without preflow. In concrete, the doping profile was examined by SIMS by continuously crystallinity growing the undoped GaAs layer and the Mg-doped AlGaInP layer. FIG. 4 shows the doping profiles when the Cp2Mg flow rate is variously set for the growth of the Mg-doped AlGaInP layer on the condition.

It can be understood from FIG. 4 that, when the Cp2Mg flow rate is low (e.g., 5 ccm, 10 ccm), the Cp2Mg is not taken into the crystals immediately after the supply of Cp2Mg is started but taken into the crystals after a lapse of a certain time. When the Cp2Mg flow rate is increased, the doping delay disappears, whereas arises a state in which the doping rate gradually increases (e.g., at 17 ccm). When the Cp2Mg flow rate is further increased, pileup occurs at the doping interface (e.g., at 50 ccm, 100 ccm). As described above, it is difficult to accurately control the doping profile without preflow.

Moreover, as described in detail next, when the Cp2Mg flow rate is increased, the activation ratio is reduced, which is therefore not suitable for the doping of the cladding layer. A p-cladding layer is generally doped to about $1 \times 10^{18}$ $cm^{-3}$. However, in order to set the carrier density in the region where the activation ratio is high, the Cp2Mg flow rate needs to be set to about 5 ccm to 10 ccm. However, in the flow rate range, the doping delay occurs as described above, and consequently doping to the neighborhood of the active layer can not be performed.

3) Activation Ratio

Figure 5:
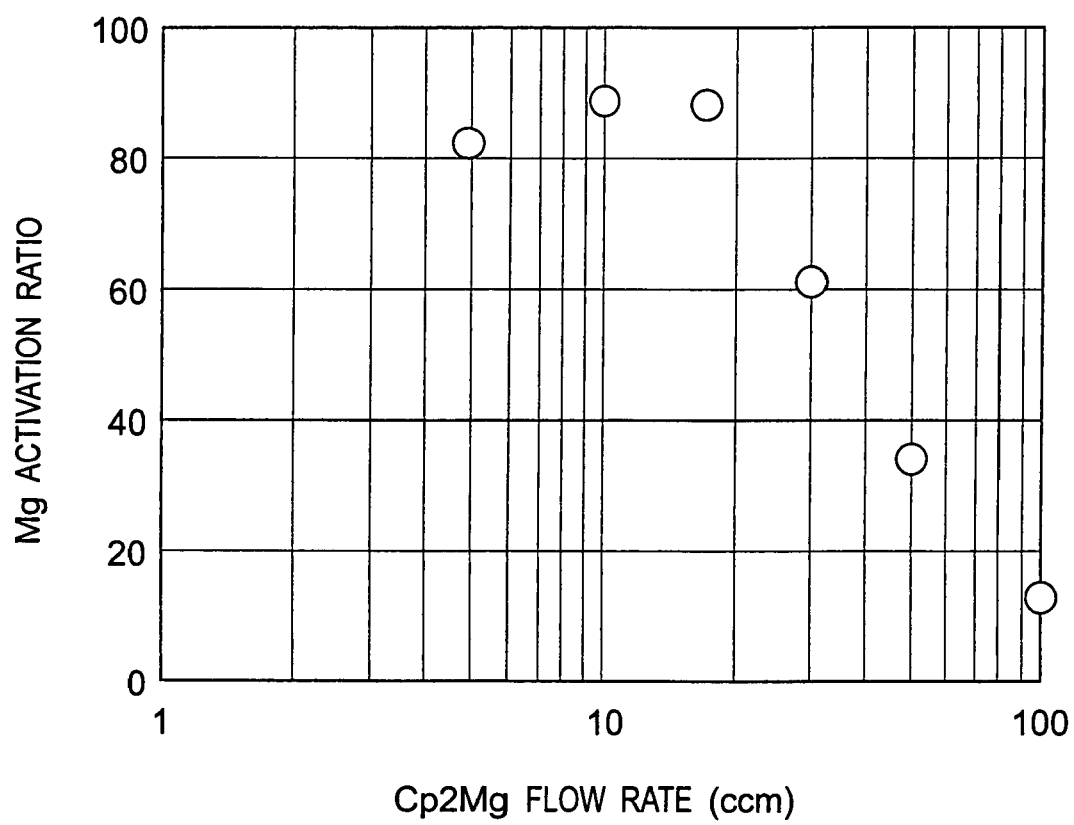
FIG. 5 is a graph showing a relation between an Mg activation ratio and a Cp2Mg flow rate.

Moreover, same sample without preflow was subjected to measurement of the carrier density by the C-V method. FIG. 5 shows the result of Mg activation ratio based on a ratio of the carrier density obtained by the C-V method to the atomic concentration obtained by SIMS.

It can be understood from FIG. 5 that the activation ratio is reduced as the Cp2Mg flow rate is increased. The carrier density of the cladding layer by doping is generally about $1 \times 10^{18}$ $cm^{-3}$, the Cp2Mg flow rate for this carrier density can be set in either a region where the activation ratio is high or low. However, in doping the cladding layer, the doping needs to be carried out in the region where the activation ratio is high. When the activation ratio is low, Mg atoms that do not operate as active carriers absorb laser light and cause a reduction in the efficiency. Moreover, inactive Mg atoms more easily move and disadvantageously diffuse while laser driving is effected, disadvantageously causing the deterioration of the crystallinity of the active layer.

4) One-Step Preflow

Figure 6:
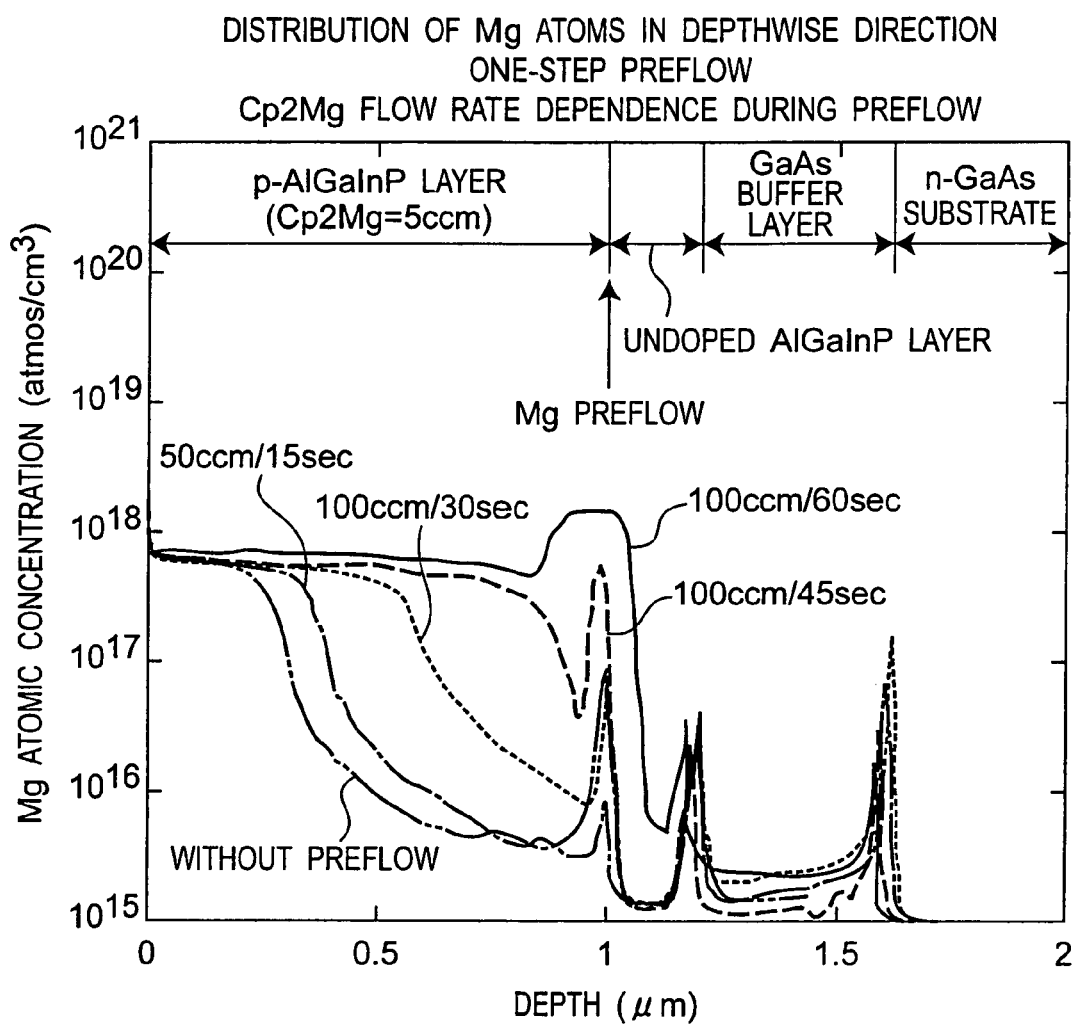
FIG. 6 is a graph showing doping profiles when one-step preflow of Mg is carried out.

Next, the present inventor examined the case of one-step preflow, i.e., the case where the preflow flow rate in the preflow period was constant. In concrete, the supply of TMG, TMA and TMI, or the group III element materials, was stopped after the undoped AlGaInP layer is crystallinically grown and before the Mg-doped AlGaInP layer is crystallinically grown, while the $PH_3$ that is the group V element material and the CP2Mg that is the Mg dopant material were flowed at a constant flow rate. FIG. 6 shows the doping profile when the preflow flow rate and the preflow time of Cp2Mg are variously set in the case of one-step preflow.

It can be understood from FIG. 6 that the doping delay is dissolving as the preflow rate of Mg is increased. This indicates that the phenomenon (memory effect) that the Cp2Mg is adsorbed and charged in the corresponding piping (precisely the main pipe 123 portion downstream from the valve 114B), the flow channel 102, the susceptor 103 and so on was able to be conquered. By performing Mg preflow to a certain extent, doping can be achieved without doping delay. Therefore, a large Cp2Mg flow rate greater than the charge is effective as the condition of one-step preflow.

However, when the Mg preflow rate is increased (100 ccm/45 sec), Mg piles up at the doping interface, and the doping decreases once, and the doping gradually increases. When the Mg preflow rate is further increased (100 ccm/60 sec), Mg largely piles up at the doping interface, and the diffusion front disadvantageously shifts into the undoped AlGaInP layer.

As described above, the one-step preflow is able to solve the problem of doping delay but unable to accurately control the doping profile.

5) Two-Step Preflow

Next, the present inventor examined the case of two-step preflow, i.e., in the case where the preflow flow rate in the preflow period is changed in two steps. In concrete, as shown in FIG. 3B, the first preflow period t11 in which the CP2Mg feed rate was set to the first flow rate and the subsequent second preflow period t12 in which the CP2Mg feed rate was set to the second flow rate smaller than the first flow rate were provided after the undoped AlGaInP layer was crystallinically grown and before the Mg-doped AlGaInP layer was crystallinically grown.

Figure 7:
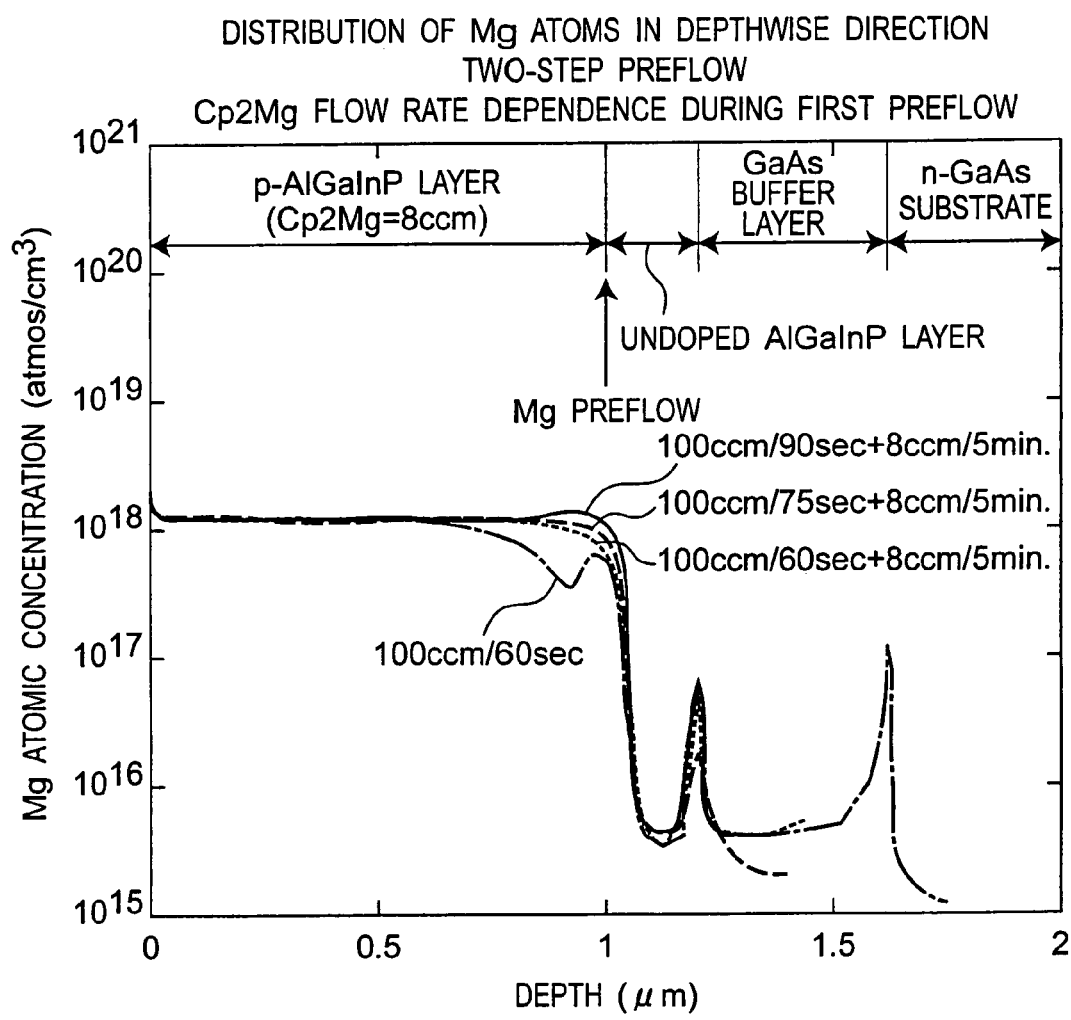
FIG. 7 is a graph showing doping profiles when two-step preflow of Mg is carried out.

FIG. 7 shows the doping profiles when the Cp2Mg flow rate in the second preflow period t12 (second flow rate) is set to a charge of 8 ccm, the duration of the second preflow period t12 is set fixed to five minutes, the Cp2Mg flow rate in the first preflow period t11 (first flow rate) is fixed to 100 ccm, and the duration of the first preflow period t11 is variably set. It is noted that the "flow rate" of Cp2Mg means not the actual flow rate of the material but the bubbling flow rate (the actual flow rate and the bubbling flow rate of the material are in a proportional relation).

As is apparent from FIG. 7, in the case of the two-step preflow, no large pileup was observed at the doping interface, and the fall of Mg at the doping interface was eliminated, allowing a steep stepped doping profile to be obtained.

When the Cp2Mg flow rate in the first preflow period t11 is increased, the Mg concentration somewhat rises at the doping interface. Conversely, when the Cp2Mg flow rate in the first preflow period t11 is decreased, the Mg concentration somewhat falls at the doping interface. Therefore, by optimally setting the Cp2Mg flow rate in the first preflow period t11, a steep stepped doping profile is obtained.

Moreover, it was discovered that the diffusion front did not shifted even when the preflow conditions (Cp2Mg flow rate in the preflow period and the duration of the preflow period) were changed in the case of the two-step preflow.

According to the above experimental results, the desired conditions in the case of the two-step preflow can be collectively enumerated as follows.

i) The Cp2Mg flow rate is set to the first flow rate greater than the charge for the Mg-doped AlGaInP layer in the first preflow period t11, and the Cp2Mg flow rate is set to the second flow rate identical to the charge for the Mg-doped AlGaInP layer in the second preflow period t12.

ii) The Cp2Mg flow rate is set to the first flow rate at which the activation ratio of Mg in the Mg-doped AlGaInP layer is not higher than 50% in the first preflow period t11, and the Cp2Mg flow rate is set to the second flow rate at which the activation ratio of Mg in the Mg-doped AlGaInP layer is not lower than 80% in the second preflow period t12.

iii) The Cp2Mg flow rate set in the first preflow period t11 is made to have a value of not smaller than five times and not greater than twenty times the Cp2Mg flow rate set in the second preflow period t12.

iv) The duration of the first preflow period t11 is set shorter than the duration of the second preflow period t12, and the expression:

(First flow rate)×(Duration of first preflow period t11)>(Second flow rate)×(Duration of second preflow period t12)

is satisfied.

6) Cp2Mg Charge and Diffusion Front

Figure 8:
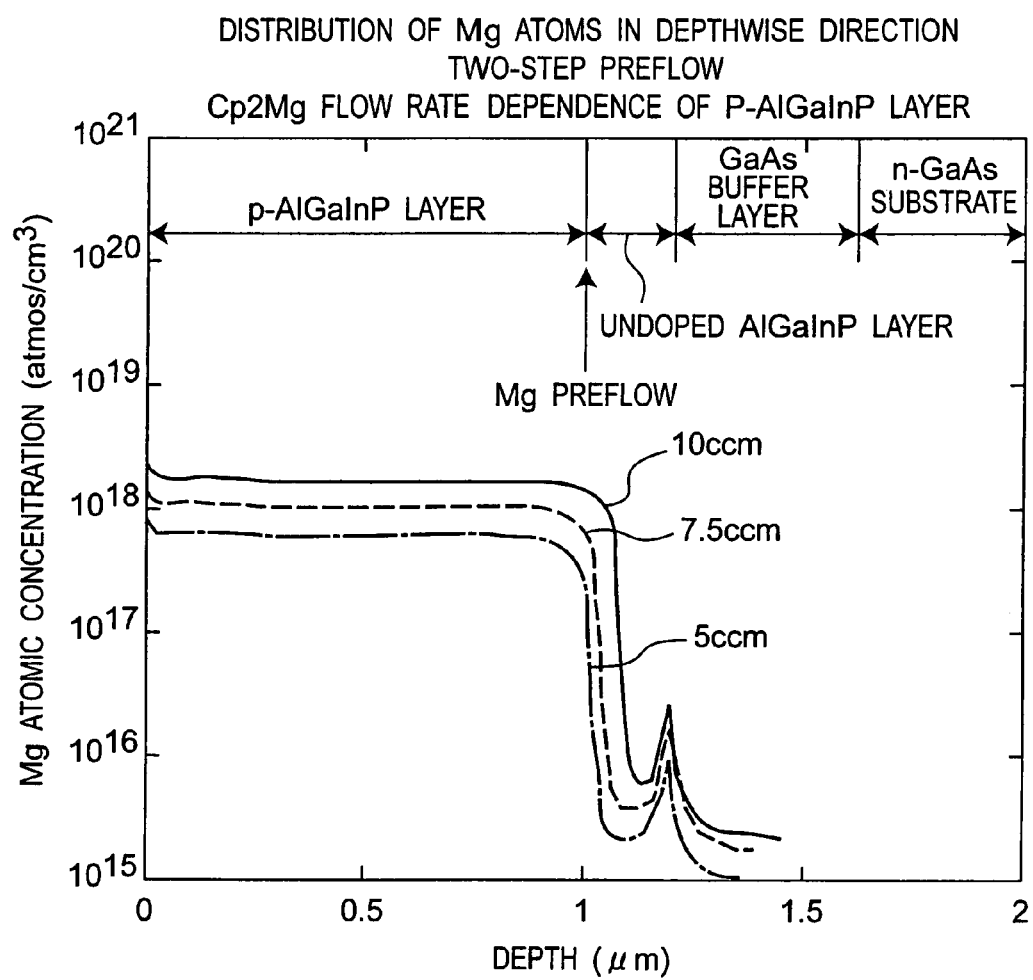
FIG. 8 is a graph showing changes in the diffusion front when the charge of Mg is variably set.

Next, the present inventor variously variably set the Cp2Mg charge for the Mg-doped AlGaInP layer in the case where the two-step preflow was carried out after the undoped AlGaInP layer was grown. FIG. 8 shows the doping profiles in the above case.

As is apparent from FIG. 8, even when the Cp2Mg charge is changed, the doping profile configuration is not changed, and a steep doping profile is obtained. However, it was discovered that, when the Cp2Mg charge was changed, the diffusion front was changed although the doping profile configuration was not changed. That is, the diffusion front shifts gradually deeper into the undoped AlGaInP layer as the Cp2Mg charge increases from 5 ccm to 10 ccm.

Since the Cp2Mg flow rate and duration and the diffusion front of the preflow change depending on the length of the piping, the structure of the reactor, the flow channel configuration, and the growth conditions of the growth temperature, the V/III ratio and so on, the optimal preflow conditions differ depending on the MOCVD apparatus used and the growth conditions. However, by selecting optimal conditions in the two-step preflow with any sort of MOCVD apparatus, the problem of doping delay can be solved, and a steep stepped doping profile can be obtained.

The Second Embodiment

FIG. 1 shows the cross-sectional structure of a red light emitting AlGaInP based semiconductor laser device manufactured by the semiconductor laser device manufacturing method of one embodiment.

The semiconductor laser device includes an n-$Ga_{0.508}In_{0.492}P$ interlayer (thickness: 0.25 μm) 2, an n-$(Al_{0.684}Ga_{0.316})_{0.511}In_{0.489}P$ first n-cladding layer (thickness: 2.6 μm) 3, an n-$(Al_{0.7}Ga_{0.3})_{0.511}In_{0.489}P$ second n-cladding layer (thickness: 0.2 μm) 4, an $(Al_{0.545}Ga_{0.455})_{0.511}In_{0.489}P$ guide layer (thickness: 35 nm) 5, a multiple quantum well layer active layer in which a $Ga_{0.445}In_{0.555}P$ well layer (thickness: 5 nm) 6 and an $(Al_{0.545}Ga_{0.455})_{0.511}In_{0.489}P$ barrier layer (thickness: 6.3 nm) 7 are layered alternately in multiplicity, an undoped $(Al_{0.7}Ga_{0.3})_{0.511}In_{0.489}P$ cladding layer (thickness: 35 nm) 8, a p-$(Al_{0.7}Ga_{0.3})_{0.511}In_{0.489}P$ first p-cladding layer (thickness: 0.237 μm) 9, a p-$Ga_{0.623}In_{0.377}P$ etching stop layer (thickness: 13 nm) 10, a p-$(Al_{0.7}Ga_{0.3})_{0.511}In_{0.489}P$ second p-cladding layer (thickness: 1.2 μm) 11, a p-$Ga_{0.508}In_{0.492}P$ interlayer (thickness: 35 nm) 12 and a p-GaAs cap layer (thickness: 0.5 μm) 13 on an n-GaAs substrate (having an 15° offset surface) 1.

The multiple quantum well active layer is a 4MQW (Multiple Quantum Well) layer including four well layers 6 in this example.

Figure 2A:
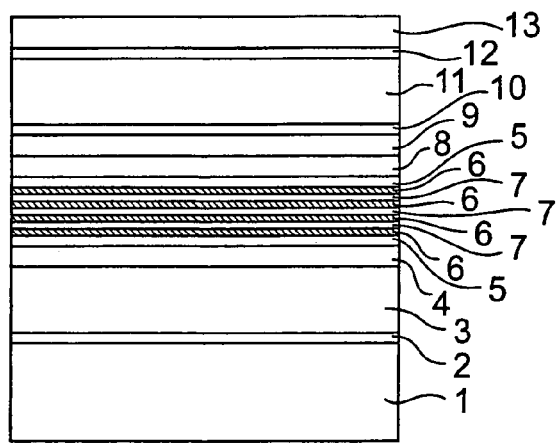
FIG. 2A is a process chart for explaining the manufacturing process of the AlGaInP based semiconductor laser device.
Figure 2B:
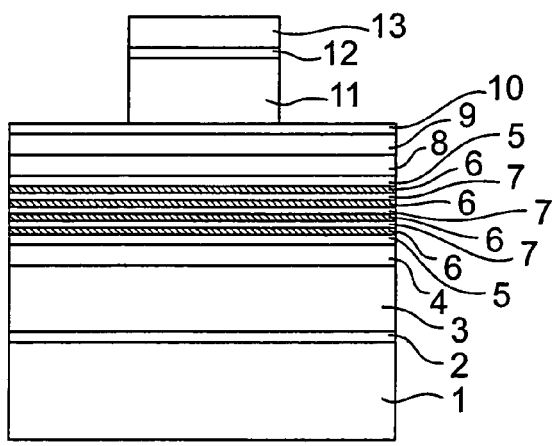
FIG. 2B is a process chart for explaining the manufacturing process of the AlGaInP based semiconductor laser device.
Figure 2C:
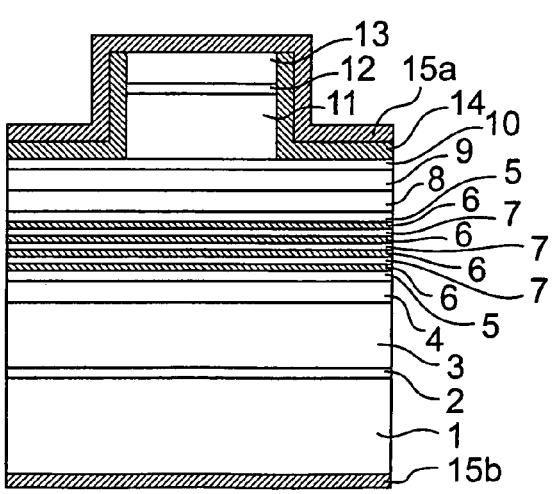
FIG. 2C is a process chart for explaining the manufacturing process of the AlGaInP based semiconductor laser device.

The semiconductor laser device is manufactured according to the procedure shown in FIGS. 2A through 2C.

First of all, as shown in FIG. 2A, the Si-doped $Ga_{0.508}In_{0.492}P$ layer (thickness: 0.25 μm, concentration: $1\times10^{18}$ cm$^{-3}$) 2, the Si-doped $(Al_{0.684}Ga_{0.316})_{0.511}In_{0.489}P$ first n-cladding layer (thickness: 2.6 μm, concentration: $3\times10^{17}$ cm$^{-3}$) 3, the Si-doped $(Al_{0.7}Ga_{0.3})_{0.511}In_{0.489}P$ second n-cladding layer (thickness: 0.2 μm, concentration: $3\times10^{17}$ cm$^{-3}$) 4 and the undoped $(Al_{0.545}Ga_{0.455})_{0.511}In_{0.489}P$ guide layer (thickness: 35 nm) 5 are formed in this order on the Si-doped GaAs substrate 1 by the MOCVD method. Subsequently, the 4MQW active layer constituted by alternately layering in multiplicity the undoped $Ga_{0.445}In_{0.555}P$ well layer (thickness: 5 nm) 6 and the undoped $(Al_{0.545}Ga_{0.455})_{0.511}In_{0.489}P$ barrier layer (thickness: 6.3 nm) 7 is formed on the resulting layered structure by the MOCVD method. Subsequently, the undoped $(Al_{0.545}Ga_{0.455})_{0.511}In_{0.489}P$ guide layer (thickness: 35 nm) 5 and the undoped $(Al_{0.7}Ga_{0.3})_{0.511}In_{0.489}P$ cladding layer (thickness: 35 nm) 8 are formed in this order on the resulting layered structure by the MOCVD method. After a preflow period is provided, the Mg-doped $(Al_{0.7}Ga_{0.3})_{0.511}In_{0.489}P$ first p-cladding layer (thickness: 0.237 μm, concentration: $1.075\times10^{18}$ cm$^{-3}$) 9, the Mg-doped $Ga_{0.623}In_{0.377}P$ etching stop layer (thickness: 13 nm) 10, the Mg-doped $(Al_{0.7}Ga_{0.3})_{0.511}In_{0.489}P$ second p-cladding layer (thickness: 1.2 μm, concentration: $1.075\times10^{18}$ cm$^{-3}$) 11, the Mg-doped $Ga_{0.508}In_{0.492}P$ interlayer (thickness: 35 nm, concentration: $2.5\times10^{18}$ cm$^{-3}$) 12 and the Zn-doped GaAs cap layer (thickness: 0.5 μm, concentration: $1\times10^{19}$ cm$^{-3}$) 13 are formed in this order.

The materials of Ga, Al, In, As, and P for MOCVD growth are provided by TMG (trimethylgallium) (20° C.), TMA (trimethylaluminum) (20° C.), TMI (trimethylindium) (25° C.), AsH$_3$ (arsine) and PH$_3$ (phosphine), respectively, and the dopant gases are provided by SiH$_4$ (monosilane) for the n-type, and Cp2Mg (20° C.) and DEZ (diethyl zinc) (20° C.) for the p-type. The growth temperature was 700° C. except for the Zn—GaAs cap layer.

The preflow period was provided as described above after the undoped cladding layer 8 was grown and before the Mg-doped first p-cladding layer 9 was grown. As shown in FIG. 3B, the two-step preflow was carried out by dividing the preflow period into the two parts of the first preflow period t11 and the second preflow period t12. Concrete preflow conditions were Cp2Mg=100 ccm effected for 75 seconds in the first preflow period t, and the charge (Cp2Mg=8 ccm) effected for five minutes in the second preflow period t12.

In the p-cladding layer 9, the Cp2Mg flow rate was set to 8 ccm in order to set the carrier density to $1.075\times10^{18}$ cm$^{-3}$.

A mask of a width of 3 μm is formed by the normal photolithography technique on the resulting layered structure, and, as shown in FIG. 2B, a stripe-shaped ridge is formed by removing the p-GaAs cap layer 13, the p-GaInP interlayer 12 and the p-(Al$_{0.7}$Ga$_{0.3}$)$_{0.511}$In$_{0.489}$P second p-cladding layer 11 outside the mask by dry etching.

After the mask on the ridge is removed, the SiN film 14 is deposited on the entire surface.

By applying a resist onto the entire surface of the film, exposing the entire surface to light and adjusting the developing time, the resist is removed until a mountain-shaped projecting portion appears in an upper portion of the ridge. A state in which the resist on the ridge is removed and the resist located out of the ridge remains is provided. By performing etching with buffered hydrofluoric acid under the conditions, the SiN film 14 formed on the ridge is removed as shown in FIG. 2C.

Subsequently, the resist is removed, and the wafer is ground to a thickness of 100 μm. An AuZn/Au electrode 15a is formed on the p-side, and an AuGe/Ni/Au electrode 15b is formed on the n-side by vapor deposition.

The resulting layered structure is cleaved in a length of 1.5 mm in a direction perpendicular to the stripe for forming each resonator, and an Si film and an Al$_2$O$_3$ film having respective reflectance of 5% and 90%, are formed at both end surfaces by vapor deposition.

Finally, each stripe was separated and mounted on a stem, completing a semiconductor laser device.

A pulse current of a duty factor of 50% was applied to the thus-manufactured semiconductor laser device, the device oscillated at an emission wavelength of 658 nm (25° C.). An oscillation threshold current was 42 mA, and the efficiency was 1.1 W/A. When the current was increased, the device oscillated without causing COD (Catastrophic Optical Damage; blackening of the end surface of the semiconductor laser device) up to an output of 500 mW. Excellent characteristics of a high characteristic temperature To=140 K was obtained.

Depending on the doping rate of the p-(Al$_{0.7}$Ga$_{0.3}$)$_{0.511}$In$_{0.489}$P first p-cladding layer 9, the shift amount of the Mg diffusion front in a direction toward the active layer is changed. By adjusting the layer thickness of the undoped (Al$_{0.7}$Ga$_{0.3}$)$_{0.511}$In$_{0.489}$P cladding layer 8 so that the Mg diffusion front does not reach the active layer, a steep doping profile without the diffusion of Mg to the active layer was able to be obtained.

As described above, according to the semiconductor laser device manufacturing method, the doping delay can be avoided in a short time by carrying out the preflow of Mg at a flow rate of not smaller than the charge. In particular, the pileup of Mg at the doping interface can be avoided by carrying out the two-step preflow. Moreover, the Mg diffusion front can be kept away at a prescribed distance from the active layer by controlling the thickness of the undoped layer before the Mg-doping.

By thus achieving a steep Mg doping profile and controlling the diffusion front, a high power semiconductor laser device of an output of not smaller than 300 mW can be provided with the reduced threshold current, improved efficiency, improved temperature characteristic and improved reliability of the semiconductor laser device.

The layer construction, composition, layer thickness, carrier density and so on of the semiconductor laser device are, of course, not limited to the values of the present embodiment. Moreover, the material system is not limited only to AlGaInP. The growth conditions are also not limited to the above conditions.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A semiconductor manufacturing method for crystallinically growing an Mg-doped group III-V compound semiconductor layer by transporting a group III element material, a group V element material and an Mg dopant material from a group III element material container, a group V element material container and a dopant material container, respectively, to a reaction region through a group III element material transport line, a group V element material transport line and a dopant material transport line and reacting the group III element material with the group V element material in the reaction region, the method comprising:

providing a group III element supply/nonsupply changeover section, a group V element supply/nonsupply changeover section and a dopant supply/nonsupply changeover section for changeover between supply and nonsupply of the materials that pass through the respective transport lines to the reaction region for the group III element material transport line, the group V element material transport line and the dopant material transport line, and crystallinically growing the Mg-undoped group III-V compound semiconductor layer in a state in which supply of the Mg dopant material to the reaction region is stopped by the dopant supply/nonsupply changeover section; and thereafter, before the Mg-doped group III-V compound semiconductor layer is crystallinically grown, providing a preflow period in which supply of the group III element material to the reaction region is stopped by the group III element supply/nonsupply changeover section, while the group V element material and the Mg dopant material are supplied to the reaction region from the group V element material container and the dopant material container through the group V element supply/nonsupply changeover section and the dopant supply/nonsupply changeover section wherein a feed rate of the Mg dopant material is variably set in the preflow period and wherein the preflow period is divided into two parts of a first preflow period with a first flow rate and a subsequent second preflow with a second period with a second flow rate.

2. The semiconductor manufacturing method as claimed in claim 1, wherein
each of the group III-V compound semiconductor layers is an AlGaInP layer.

3. The semiconductor manufacturing method as claimed in claim 1, wherein,
the feed rate of the Mg dopant material is set to a first flow rate greater than a certain charge in the first preflow period, and
the feed rate of the Mg dopant material from the dopant material container is set to a second flow rate identical to the charge in the second preflow period.

4. The semiconductor manufacturing method as claimed in claim 1, wherein
the feed rate of the Mg dopant material is set to a first flow rate at which an activation ratio of Mg in the Mg-doped group III-V compound semiconductor layer is not higher than 50% in the first preflow period, and
the feed rate of the Mg dopant material is set to a second flow rate at which the activation ratio of Mg in the Mg-doped group III-V compound semiconductor layer is not lower than 80% in the second preflow period.

5. The semiconductor manufacturing method as claimed in claim 1, wherein
the feed rate of the Mg dopant material set in the first preflow period is made to have a value of not smaller than five times and not greater than twenty times the feed rate of the Mg dopant material set in the second preflow period.

6. The semiconductor manufacturing method as claimed in claim 1, wherein
in the first preflow period the feed rate of the Mg dopant material is set to a first flow rate and in the second preflow period the feed rate of the Mg dopant material is set to a second flow rate, and
a duration of the first preflow period is set shorter than a duration of the second preflow period and a product of the first flow rate and the duration of the first preflow period is set greater than a product of the second flow rate and the duration of the second preflow period.

7. The semiconductor manufacturing method as claimed in claim 1, wherein
the Mg dopant material is biscyclopentadienyl magnesium or bisethyl cyclopentadienyl magnesium.

8. A semiconductor laser device manufacturing method including the semiconductor manufacturing method claimed in claim 1, comprising:
the step of crystallinically growing an n-type AlGaInP cladding layer, a multiple quantum well active layer, an undoped AlGaInP cladding layer as the Mg-undoped group III-V compound semiconductor layer, an Mg-doped AlGaInP cladding layer as the Mg-doped group III-V compound semiconductor layer in this order on an n-type GaAs substrate by an MOCVD method; and
providing the preflow period after the undoped AlGaInP cladding layer is grown and before the Mg-doped AlGaInP cladding layer is grown.

* * * * *